(12) United States Patent
Evans et al.

(10) Patent No.: US 6,430,934 B2
(45) Date of Patent: Aug. 13, 2002

(54) SUPER COOLER FOR A HEAT PRODUCING DEVICE

(75) Inventors: Nigel Evans, Sutton Coldfield; William E. Hewlett, Burton on Trent, both of (GB)

(73) Assignee: Light and Sound Design Ltd. (GB)

( * ) Notice: Subject to any disclaimer, the term of this patent is extended or adjusted under 35 U.S.C. 154(b) by 0 days.

(21) Appl. No.: 09/780,025

(22) Filed: Feb. 9, 2001

Related U.S. Application Data
(60) Provisional application No. 60/181,530, filed on Feb. 10, 2000.

(51) Int. Cl.⁷ .............................................. F25B 21/02
(52) U.S. Cl. ............................................ 62/3.2; 62/3.7
(58) Field of Search ............................... 62/3.1, 3.2, 3.3, 62/3.7; 315/291

(56) References Cited

U.S. PATENT DOCUMENTS

| | | | | |
|---|---|---|---|---|
| 4,848,090 A | * | 7/1989 | Peters | 62/3.3 |
| 5,515,682 A | * | 5/1996 | Nagakubo et al. | 62/3.7 |
| 5,609,032 A | * | 3/1997 | Bielinski | 62/3.7 |
| 5,912,773 A | | 6/1999 | Barnett et al. | |
| 6,012,291 A | * | 1/2000 | Ema | 62/3.7 |
| 6,098,408 A | | 8/2000 | Levinson et al. | |
| 6,208,087 B1 | * | 3/2001 | Hughes et al. | 315/291 |

\* cited by examiner

Primary Examiner—Denise L. Esquivel
Assistant Examiner—Melvin Jones
(74) Attorney, Agent, or Firm—Fish & Richardson P.C.

(57) ABSTRACT

A super cooler device including a thermo electric cooler on a digital micro mirror device.

35 Claims, 3 Drawing Sheets

SUPER COOLER FOR A HEAT PRODUCING DEVICE

CROSS-REFERENCE TO RELATED APPLICATIONS

The present application claims benefit of U.S. Provisional Application No. 60/181,530 filed Feb. 10, 2000.

The present application relates to cooling of a heat producing device, using a thermoelectric cooler arranged as a super cooler. More specifically, the present application teaches cooling of a device, such as a digital mirror device, which requires a specified temperature gradient across the device, using a supercooled element.

BACKGROUND

Electronic devices often have specified cooling requirements. One device that has specific cooling requirements is a digital micromirror device ("DMD") available from Texas Instruments ("TI"). The manufacturer of this device has specified a maximum overall temperature for the device and also a specified maximum temperature gradient between the front and rear faces of the device during operation.

For example, the temperature of the specific DMD used in this application needs to be kept below 55° C., however, in this application it is desirable to keep the device at or below ambient. This may allow operation in an ambient environment up to 55° C., such as may be encountered in a stage theater or studio environment. The temperature differential between the front and rear of the DMD cannot exceed 15°. Besides the heat from the operation of the DMD itself, large amounts of heat from a high intensity light source must be dissipated.

BRIEF DESCRIPTION OF THE DRAWINGS

These and other aspects will now be described in detail with reference to the accompanying, wherein.

DETAILED DESCRIPTION

According to the present system, a "supercooler" device, is used to monitor and control the temperature of a device which can control light on a pixel-by-pixel basis, e.g. a digital mirror device (DMD).

Figure 1:
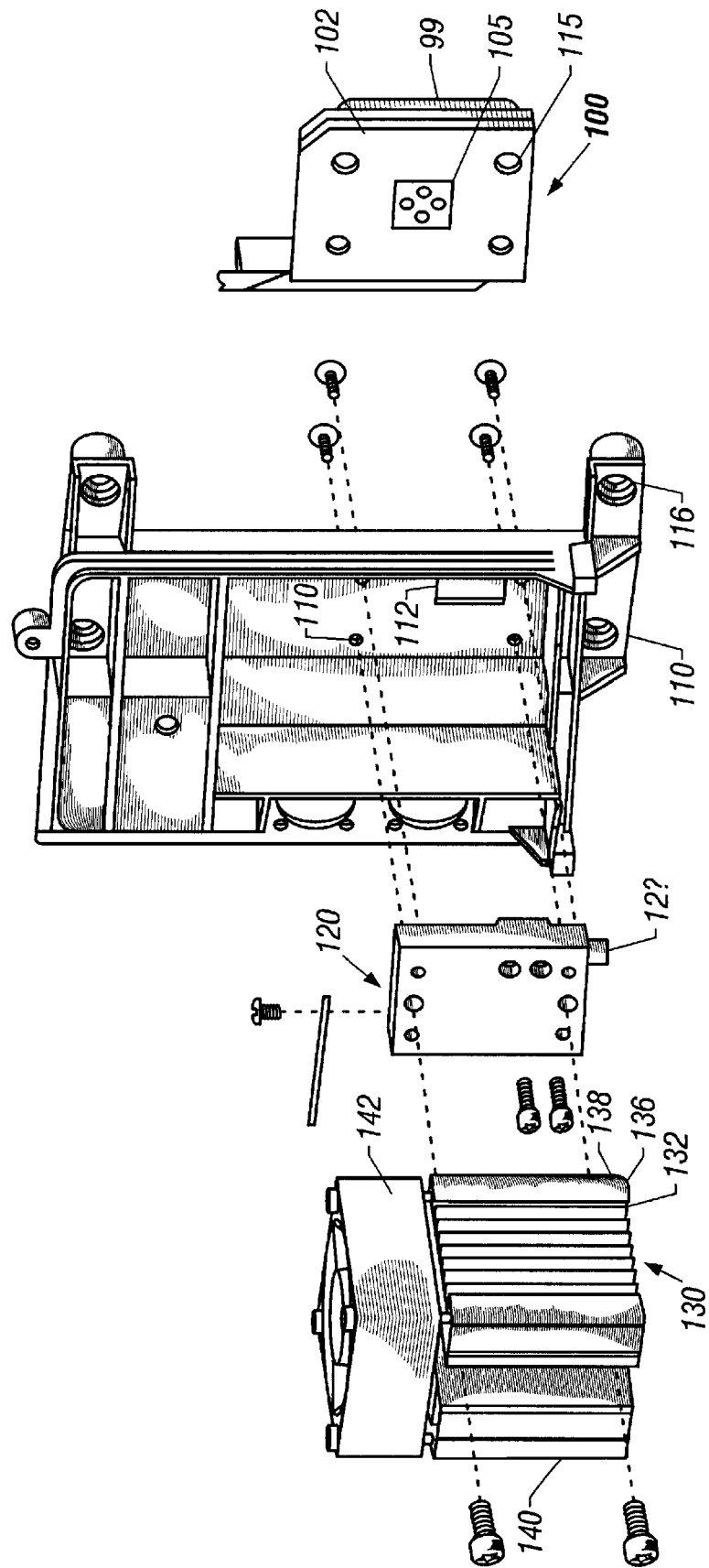
FIG. 1 shows an exploded diagram of the parts making up the supercooler assembly.

The mechanical structure of the supercooling assembly is shown in FIG. 1. The pixel element is a DMD 99, which forms part of a DMD assembly 100. As shown, a thermal connection 105 to the DMD 99 is provided.

A cold plate 120 is assembled to a mounting bracket 110 in a manner which allows minimal thermal transfer between the two components. The DMD is attached directly to the cold plate 120, hereby allowing maximum thermal transfer between the DMD and cold plate 120, but minimal thermal transfer to the mounting bracket 110. The rear surface of the cold plate 120 is directly connected to one side of the thermoelectric device 130, and the other side of the thermoelectric device is connected to a heat sink/fan assembly 140.

Insulating foam gaskets are fitted around the DMD rear stud, the cold plate, and the thermoelectric device in order to isolate them from the outside ambient air. This improves the efficiency of the cooling system by eliminating the effects of condensation and properly controlling the flow of heat from the DMD to the cold plate, through the thermoelectric device, and into the heat sink/fan assembly.

The thermoelectric cooler element 130 operates as conventional to produce one cold side 131 and one hot side 132. The hot side is coupled to the heat sink/fan assembly 140 to dissipate the heat. In a preferred mode, the heat sink/fan assembly is columnar is shape, with a substantially square cross section. This facilitates using a square shaped fan housing 142. The square shaped fan unit allows the maximum use of the space for a fan, whose blades usually follow a round shape. Any type of cooling fan, however can be used.

The DMD assembly 100 has an extending rear stud 105 which is covered with thermal grease. This stud extends though a hole 112 in the bracket assembly 110.

The plate 120 is actively cooled, and hence becomes a "cold plate". The active cooling keeps the metal plate at a cooled temperature, and the thermal characteristics of the plate material allow the heat flowing into the plate from the DMD to be evenly distributed throughout the entire plate. The plate is preferably about ¼" to ⅜" in thickness, and of comparable outer size to the thermal contact area of the thermoelectric cooler element 130. This allows the localized and concentrated heat at the rear stud of the DMD to be evenly dissipated through the cold plate and then efficiently transferred through the full surface area of the thermoelectric cooler element. As shown, the assembly employs thermal insulation techniques such as fiber/plastic sleeves and washers in the mounting of components, in order to prevent heat transfer via mounting screws etc. Since this heat transfer could be uncontrolled, it could otherwise reduce the cooling efficiency.

Figure 2:
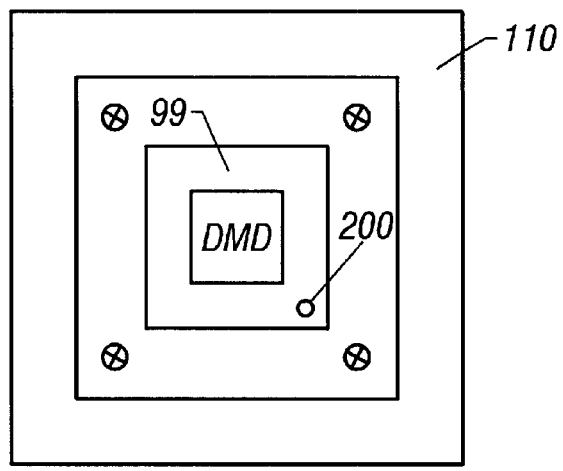
FIG. 2 shows the rear of the DMD and parts which are assembled to the DMD.

The front of the DMD is shown in FIG. 2. Temperature sensor 200 is mounted to have a fast response to temperature changes. A second temperature sensor 122 is mounted to the cold plate 120 and effectively measures the temperature of the rear of the DMD 99. This second temperature sensor 122 therefore monitors the back temperature.

The hot side 132 of the thermoelectric cooler is coupled to a heat sink assembly 130. The heat sink assembly 140 includes a heat sink element 140. As shown, the device has fins and a top-located cooling fan 142.

Figure 3:
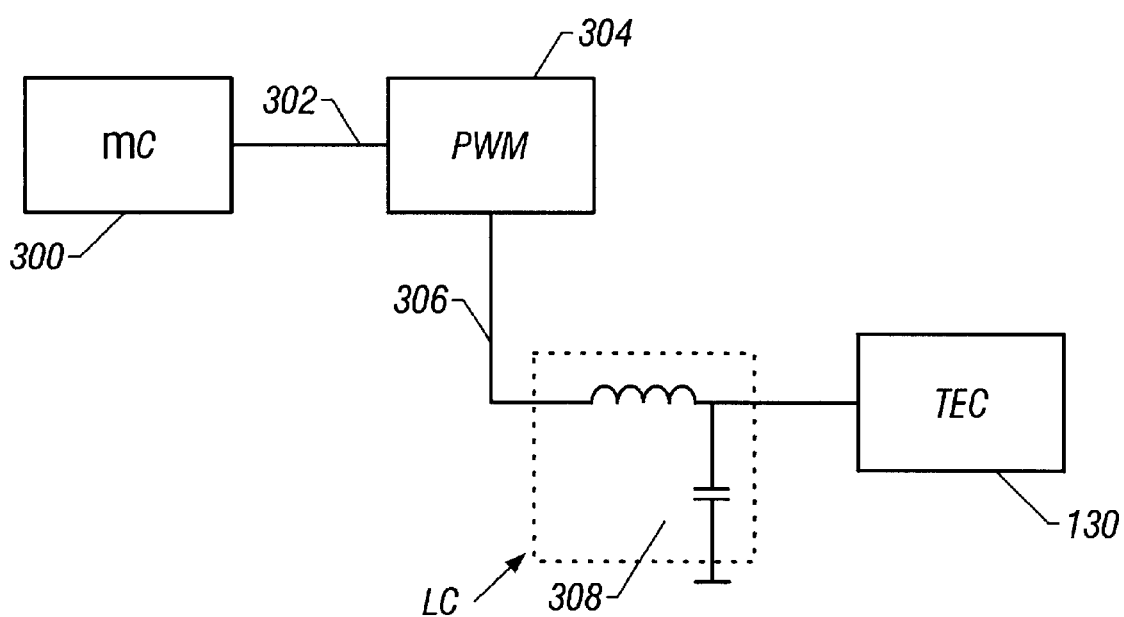
FIG. 3 shows a circuit for driving a thermoelectric cooler.

A block diagram of the control system is shown in FIG. 3. Controller 300 operates in a closed loop mode to maintain a desired temperature differential across the sensors 122, 200.

One important feature of the present application is that the thermoelectric cooler is controlled to maintain the temperature of the DMD at the desired limits. These limits are set at a target of 16° C. on the front, and a differential no greater than 15° between front and rear. The thermoelectric cooler is controlled using very low frequency or filtered pulse width modulation. In a first embodiment, the controlling micro controller 300 produces an output 302, e.g., digital or analog. This drives a pulse width modulator 304. The output of the pulse width modulator is a square wave 306 or a signal close to a square wave, with sufficient amplitude and power to produce the desired level of cooling down the thermoelectric cooler. The square wave is coupled to an LC filter 308 which has a time constant effective to smooth the 20 KHz switching frequency. The output to the thermoelectric cooler is therefore a DC signal. This drives the thermoelectric cooler 130 and causes it to produce a cooling output. In a second embodiment, the LC filter is removed and the TEC is driven directly by the square wave 306 at a lower frequency, e.g. 1 Hz.

Figure 4:
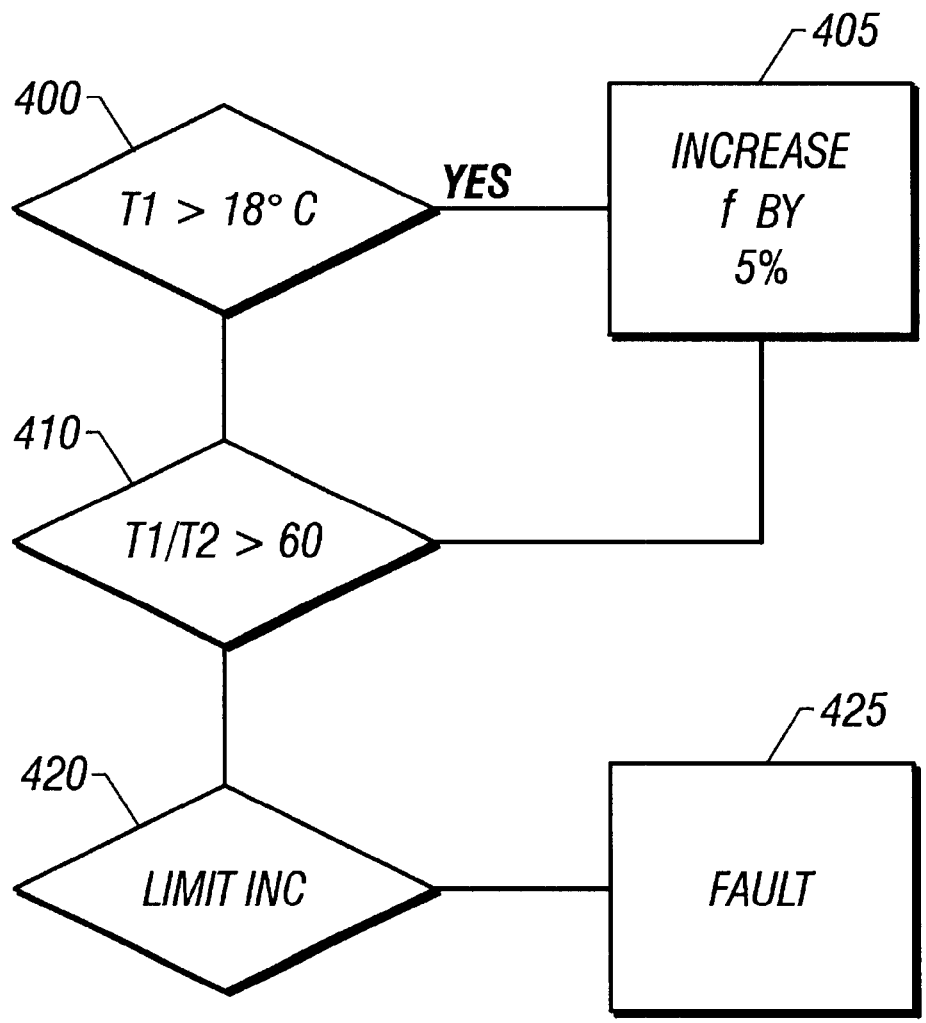
FIG. 4 shows a flowchart of operation. 2.

The microcontroller operates according to the flowchart of FIG. 4. Step 400 determines if the temperature of the first temperature sensor T1 is greater than 16°. If so, the output to the TEC remains "on", resulting in further cooling. When the temperature falls below 160, the drive to the TEC is switched off. The sample period is approximately ½ second between samples.

At 410, the system checks temperature of the first sensor (T1) and of the second sensor (T2) to determine if the differential is greater than 15°. If so, the output is switched "on". Step 420 indicates a limit alarm, which represents the time of increase if the rate of change continues. If the rate of change continues to increase, as detected at step 420, a fault is declared at step 425. This fault can cause, for example, the entire unit to be shut off, to reduce the power and prevent permanent damage.

Other embodiments are contemplated.

What is claimed is:

1. An apparatus, comprising:
   a temperature sensing device, monitoring a front temperature of a front surface of a first driven device, and a rear temperature related to a rear surface of the first driven device;
   a controller, detecting both a temperature of the first driven device and a temperature differential across the first driven device;
   a thermoelectric cooler, coupled to actively cool the first driven device under control of said controller; and
   wherein said controller produces outputs which control both overall temperature of the first driven device and temperature differential of the first driven device; and
   a super cooler assembly, connected to a hot side of said thermoelectric cooler, said super cooler assembly including a metal plate, a heat sink, connected to said metal plate, and a fan, actively cooling said heat sink.

2. An apparatus as in claim 1, wherein said temperature sensing device includes a sensor mounted to said metal plate.

3. An apparatus as in claim 1, further comprising insulation, mounted to insulate portions of said first driven device, to insulate said first driven device from ambient.

4. An apparatus as in claim 3, wherein said first driven device is a digital mirror device.

5. An apparatus as in claim 1, wherein said heat sink has a cross-sectional area which is substantially square, and an outer frame of said fan is substantially square and coupled to said heat sink.

6. An apparatus as in claim 5, wherein said heat sink has a square cross-section, in a first direction, and has a rectangular cross-section in a second direction.

7. An apparatus, comprising:
   a temperature sensing device, monitoring a front temperature of a front surface of a first driven device, and a rear temperature related to a rear surface of the first driven device;
   a controller, detecting both a temperature of the first driven device and a temperature differential across the first driven device;
   a thermoelectric cooler, coupled to actively cool the first driven device under control of said controller;
   wherein said controller produces outputs which control both overall temperature of the first driven device and temperature differential of the first driven device;
   a pulse width modulated device, driven by said controller, to produce a pulse width modulated output to drive said thermoelectric cooler; and
   a filter, which filters said pulse width modulated output, to provide a smoothed output.

8. An apparatus as in claim 7, wherein said filter includes an LC filter.

9. An apparatus, comprising:
   a temperature sensing device, monitoring a front temperature of a front surface of a first driven device, and a rear temperature related to a rear surface of the first driven device;
   a controller, detecting both a temperature of the first driven device and a temperature differential across the first driven device; and
   a thermoelectric cooler, coupled to actively cool the first driven device under control of said controller;
   wherein said controller produces outputs which control both overall temperature of the first driven device and temperature differential of the first driven device,
   wherein said controller monitors overall temperature of the first driven device, a ratio between front and rear temperature of the first driven device, and an increment over time of cooling of the first driven device.

10. An apparatus as in claim 9, wherein the first driven device is a digital mirror device.

11. An apparatus, comprising:
    a temperature sensing device, monitoring a front temperature of a front surface of a first driven device, and a rear temperature related to a rear surface of the first driven device;
    a controller, detecting both a temperature of the first driven device and a temperature differential across the first driven device;
    a thermoelectric cooler, coupled to actively cool the first driven device under control of said controller;
    wherein said controller produces outputs which control both overall temperature of the first driven device and temperature differential of the first driven device,
    wherein the first driven device is a digital mirror device; and further comprising insulation between said digital mirror device and ambient.

12. An apparatus, comprising:
    a digital micro mirror device assembly, including a mounting plate for a digital micro mirror device, and a digital micro mirror device mounted on said mounting plate; and
    insulation, positioned around at least a part of said digital micro mirror device, to insulate said at least part of the digital micro mirror device from ambient.

13. An apparatus as in claim 12, further comprising a thermoelectric cooling device, coupled to cool said at least part of the digital micro mirror device.

14. An apparatus as in claim 13, further comprising a controller for said thermoelectric cooling device.

15. An apparatus as in claim 14, further comprising temperature sensors on said digital micro mirror device, wherein said controller is operative responsive to said temperature sensors, to control at least one temperature of said digital micro mirror device.

16. An apparatus as in claim 15, wherein said controller controls production of a pulse width modulated signal, whose pulse width is based on said temperature.

17. An apparatus, comprising:
    a digital micro mirror device assembly, including a digital micro mirror device mounted thereon; and an active cooling unit, coupled to cool said digital micro mirror device, wherein said active cooling unit includes a thermoelectric cooler a temperature sensor, sensing a temperature of said digital micro mirror device, and a controller, controlling said thermoelectric cooler based on the sensed temperature;

wherein said temperature sensor includes a first temperature sensor sensing a temperature near the front of the digital micro mirror device, and a second temperature sensor sensing a temperature near the rear of the digital micro mirror device further comprising a controller for said active cooling unit, said controller controlling production of a pulse width modulated signal that controls the active cooling unit; and wherein said controller operates to control the thermoelectric cooler based on both the front temperature, and a difference between the front and rear temperatures;

a filter which smooths said pulse width modulated signal to reduce an amount of transitions therein.

18. An apparatus as in claim, wherein said filter includes an LC filter.

19. An apparatus, comprising:

a digital micro mirror device assembly, including a digital micro mirror device mounted thereon;

an active cooling unit, coupled to cool said digital micro mirror device; and insulation coupled between said digital micro mirror device and ambient, to insulate said digital micro mirror device from ambient.

20. An apparatus, comprising:

a digital micro mirror device assembly, including a digital micro mirror device mounted thereon; and an active cooling unit, coupled to cool said digital micro mirror device, a plate formed of heat distributing material, coupled to said digital micro mirror device assembly and said active cooling unit, and of a size which is affective to evenly distribute heat from the digital micro mirror device assembly into said plate; and a heat sink and fan, connected to said plate, to dissipate heat from said plate.

21. A method, comprising:

operating a digital micro mirror device in an environment where one side thereof is exposed to heat from light that is applied thereto; and actively cooling the other side of said digital micro mirror device.

22. A method as in claim 21, wherein said actively cooling comprises using a thermoelectric cooler coupled to an other side of said digital micro mirror device.

23. A method as in claim 21, wherein said actively cooling comprises using a pulse width modulated signal to control an amount of cooling provided by said thermoelectric cooler.

24. A method as in claim 23, further comprising filtering said pulse width modulated signal prior to applying said signal to said thermoelectric cooler.

25. A method as in claim 21, further comprising detecting a temperature of said digital micro mirror device, and wherein an amount of said active cooling is based on the detected temperature.

26. A method as in claim 25, wherein said detecting comprises detecting a temperature of the front of the digital micro mirror device and a temperature of the rear of the digital micro mirror device.

27. A method as in claim 26, wherein said amount of active cooling is based both on a temperature of the front of the device and on a differential between the temperature of the front of the device and a temperature of the rear of the device.

28. A method as in claim 21, further comprising:

detecting a temperature of the digital micro mirror device;

detecting a temperature near a rear of the digital micro mirror device;

determining a temperature of the digital micro mirror device, and a difference between a temperature of the micro mirror device and a rear temperature of the micro mirror device, and changing a cooling amount based on both said temperature and said difference.

29. A method as in claim 28, further comprising determining a rate of change of increment of temperature, and establishing a fault if said rate of change is higher than a specified amount.

30. A method as in claim 21, further comprising insulating the digital micro mirror device from ambient temperature.

31. A method, comprising:

energizing a digital micro mirror device;

determining a first temperature related to a front of the digital micro mirror device and a second temperature related to a rear temperature of the digital micro mirror device;

forming a pulse width modulated control signal based on both temperature on the front of the digital micro mirror device, and a difference between temperature of the front and rear of the digital micro mirror device; and actively cooling the rear of the digital micro mirror device based on said pulse width modulated signal.

32. A method as in claim 31, further comprising filtering said pulse width modulated signal, prior to said, actively cooling.

33. A method as in claim 31, further comprising insulating said digital micro mirror device from ambient temperature.

34. A method as in claim 31, further comprising dissipating heat from the actively cooling using a heat sink and fan.

35. A method as in claim 31, wherein said forming comprises establishing a desired temperature and a desired temperature differential, and increasing and active amount of said pulse width modulated signal when said desired temperature is exceeded, and decreasing said active amount when said desired temperature differential is exceeded.

* * * * *